(12) United States Patent
Wu et al.

(10) Patent No.: US 12,205,631 B2
(45) Date of Patent: Jan. 21, 2025

(54) RANDOM ACCESS MEMORY WITH METAL BRIDGES CONNECTING ADJACENT READ TRANSISTORS

(71) Applicant: UNITED MICROELECTRONICS CORP., Hsin-Chu (TW)

(72) Inventors: Ming-Hsiu Wu, Tainan (TW); Tsung-Hsun Wu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 219 days.

(21) Appl. No.: 18/070,484

(22) Filed: Nov. 29, 2022

(65) Prior Publication Data

US 2024/0144994 A1    May 2, 2024

(30) Foreign Application Priority Data

Oct. 28, 2022    (TW) .................................. 111141084

(51) Int. Cl.
| | |
|---|---|
| *G11C 11/24* | (2006.01) |
| *G11C 11/408* | (2006.01) |
| *G11C 11/4094* | (2006.01) |
| *G11C 11/4096* | (2006.01) |

(52) U.S. Cl.
CPC ...... *G11C 11/4096* (2013.01); *G11C 11/4085* (2013.01); *G11C 11/4094* (2013.01)

(58) Field of Classification Search
CPC ................................................. G11C 11/4045
USPC ......................................................... 365/149
See application file for complete search history.

(56) References Cited

U.S. PATENT DOCUMENTS

| | | | |
|---|---|---|---|
| 6,809,979 B1 | 10/2004 | Tang | |
| 8,379,433 B2 | 2/2013 | Houston | |
| 10,614,875 B2 | 4/2020 | Manning | |
| 2017/0294221 A1* | 10/2017 | Giterman | ................ G11C 11/41 |

* cited by examiner

*Primary Examiner* — Hoai V Ho
(74) *Attorney, Agent, or Firm* — Winston Hsu

(57) ABSTRACT

A random access memory, including a write transistor with a gate electrically connected to a write word line and a drain electrically connected to a write bit line, a first read transistor and a second read transistor with gates electrically connected to a source of the write transistor to form a storage node, drains electrically connected to a read bit line and a common source electrically connected to a read word line so that the first read transistor and a second read transistor are in parallel connection, and a capacitor electrically connected to the storage node.

14 Claims, 3 Drawing Sheets

RANDOM ACCESS MEMORY WITH METAL BRIDGES CONNECTING ADJACENT READ TRANSISTORS

BACKGROUND OF THE INVENTION

1. Field of the Invention

The present invention relates generally to a random access memory (RAM), and more specifically, to a 3T1C (three transistors and one capacitor) RAM with a metal bridge connecting adjacent gates and with read transistors in parallel connection.

2. Description of the Prior Art

Logic-compatible gain cell embedded dynamic random access memory (eDRAM) arrays are considered in the industry as an alternative to static random access memory (SRAM) due to the advantages like small size, non-ratioed operation, low static leakage and two-port functionality. However, conventional gate control eDRAM implementations requires boosted control signal to write full voltage levels to the memory cell in order to reduce the refresh rate and shorten access times, thus extra power supply and on-chip charge pump are required in the circuit to boost the voltage of control signal, as well as non-trivial level shifting and toleration of high voltage levels. In addition, common metal-oxide-semiconductor field-effect transistor (MOSFET) used in eDRAM has sub-threshold swing (SS) up to 60 mV/decade, which is not effective for reducing the operating voltage of the device. High operating voltage also means significant power consumption and increased leakage possibility. Accordingly, it is urgent for those of skilled in the art to improve the architecture of present gain cell eDRAM, in order to overcome the disadvantages above.

SUMMARY OF THE INVENTION

In the light of the aforementioned disadvantages in conventional design of gain cell eDRAM, the present invention hereby provides a novel RAM circuit and layout, with features of metal bridges connecting two adjacent and paralleled read transistors to increase read current. In addition, tunnel field-effect transistors (TFET) are used in the invention as read transistors to significantly reduce required operating voltage, thereby reducing overall power consumption of the device, as well as preventing current leakage.

The objective of present invention is to provide a random access memory, including: a write transistor with a first gate, a first source and a first drain, wherein the first gate is electrically connected to a write word line, and the first drain is electrically connected to a write bit line; a first read transistor with a second gate, a common source and a second drain; a second read transistor with a third gate, the common source and a third drain, wherein the third gate and the second gate are electrically connected to the first source of the read transistor, and a junction of the third gate, the second gate and the first source is a storage node, and the second drain and the third drain are electrically connected to a read bit line, and the common source is electrically connected to a read word line, so that the first read transistor and the second read transistor are in parallel connection; and a capacitor electrically connected to the storage node.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
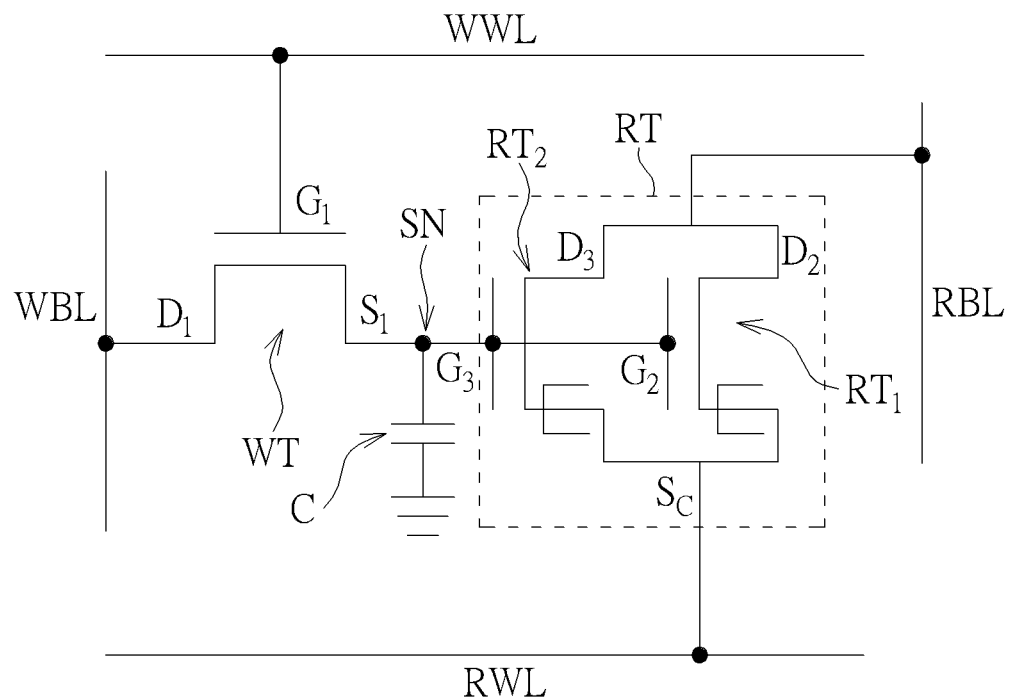
FIG. 1 is a schematic circuit diagram of a random access memory (RAM) in accordance with the preferred embodiment of the present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). In addition, spatially relative terms, such as "beneath," "below," "lower," "above," "upper," and the like, may be used herein for ease of description to describe one element or feature's relationship to another element (s) or feature (s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Please refer first to FIG. 1, which is a schematic circuit diagram of a random access memory (RAM) in accordance with the preferred embodiment of present invention. The RAM of present invention is preferably a dynamic random access memory (DRAM), for example embedded DRAM (eDRAM), which is consisted of three main components of one write transistor WT, two read transistors $RT_1$, $RT_2$ and one capacitor C, which constitute 3T1C (three transistors and one memory cell) RAM architecture of the present invention. In the aspect of circuit connection, the two read transistors $RT_1$, $RT_2$ are in parallel connection to function collectively the read device RT of present invention, with a common source $S_C$ at one end connected to a read word line RWL, and a second drain $D_2$ and a third drain $D_3$ at the other end connected to a read bit line RBL. The gates $G_2$, $G_3$ of read transistors $RT_1$, $RT_2$ are connected each other through a bridge. Since the aforementioned two read transistors $RT_1$, $RT_2$ are designedly in parallel connection, higher read current may be obtained in the read operation to improve read performance. Furthermore, in the embodiment of present invention, the read transistors $RT_1$, $RT_2$ are preferably tunnel field-effect transistors (TFET), with lower sub-threshold swing (SS) to reduce the operating voltage required by gates and achieve faster switching speed, thereby reducing overall power consumption in the operation of the device as well as preventing current leakage.

Refer still to FIG. 1. The write transistor WT of present invention may be a common metal-oxide-semiconductor field-effect transistor (MOSFET), with a first drain $D_1$ at one terminal connected with a write bit line WBL and a first source $S_1$ at another terminal connected with the gates $G_2$, $G_3$ of the read transistors $RT_1$, $RT_2$. The junction of the first source $S_1$ and the gates $G_2$, $G_3$ is a storage node SN of the RAM in present invention, and it is further connected to a capacitor C. The gate $G_1$ of write transistor WT is connected to a write word line WWL. The write transistor WT, the first read transistor $RT_1$ and the second read transistor $RT_2$ collectively constitute a memory cell in the RAM.

Figure 2:
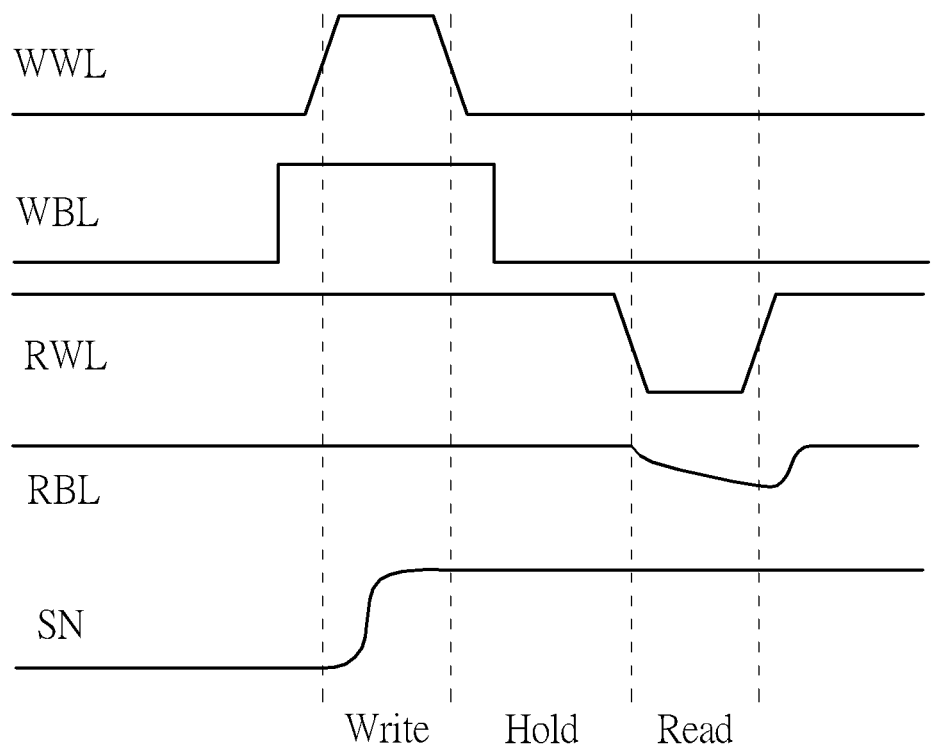
FIG. 2 is a timing diagram of different circuit lines in the circuit in write and read operations of a RAM in accordance with the preferred embodiment of the present invention.

Please refer to FIG. 2, which is a timing diagram of different circuit lines in the circuit in write and read operations of a RAM in accordance with the preferred embodiment of present invention, and the circuit diagram of FIG. 1 may be referred concurrently to understand the modes of operation. In the operation of writing high logic level "1" in the RAM of present invention, a high voltage signal is applied from the write word line WWL to the gate $G_1$ of write transistor WT to open the channel of write transistor WT (first drain $D_1$ to first source $S_1$). A write voltage signal is applied from the write bit line WBL to the storage node SN through the opened write transistor WT, so that the storage state at storage node (capacitor C) is changed to high logic level "1". The read word line RWL and read bit line RBL at this time remains in their pre-charge levels. Low logic level "0" may also be written in the same way above, with difference that the write voltage signal applied from the write bit line WBL is negative voltage level.

Refer still to FIG. 2. After the high logic level "1" is written, a hold time is elapsed for the register to stabilize the signal value, ensuring the register value transferred to the next layer is correct. After the signal is stable, in the read operation of RAM, an overdrive voltage (the pre-charge voltage is changed to a low voltage level) is applied from the read word line RWL to the read transistors $RT_1$, $RT_2$, so that the terminal of read bit line RBL is discharged and voltage-dropped, and the resistance at channels of read transistors $RT_1$, $RT_2$ may be obtained to further obtain the voltage level at gate switches of the read transistors $RT_1$, $RT_2$, i.e. storage states of the connected storage node SN. Low logic level "0" may also be read in the same way above, with the difference that the overdrive of read word line RWL may inversely increase the voltage at the terminal of read bit line RBL.

Figure 3:
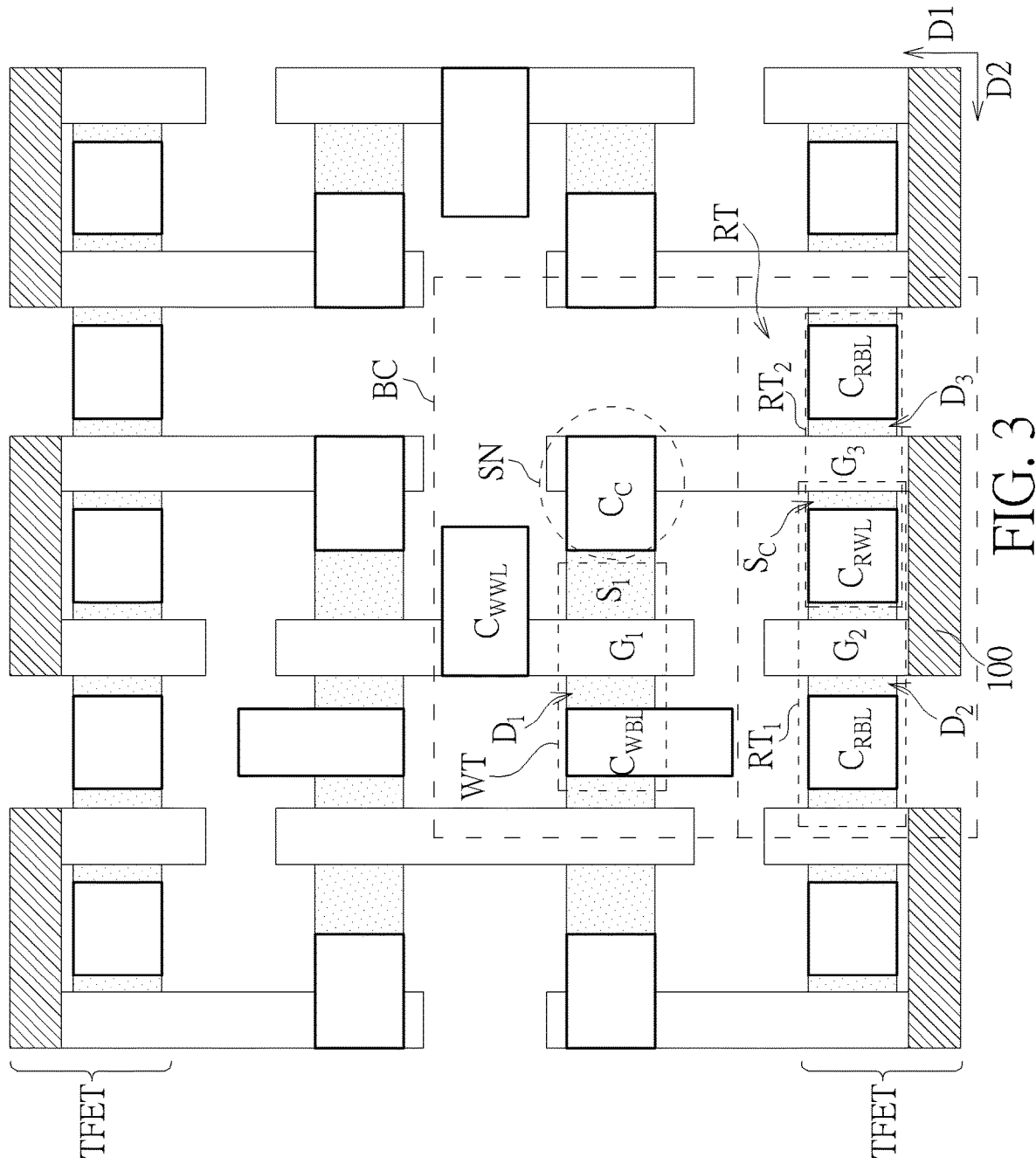
FIG. 3 is a circuit layout of a RAM in accordance with one embodiment of the present invention.

Please refer now to FIG. 3, which is a circuit layout of a RAM in accordance with one embodiment of the present invention, and the circuit diagram of FIG. 1 may be referred concurrently to understand its connection mode. The layout of RAM in the present invention includes a substrate (i.e. the blank region in the figure). The material of substrate may include extensive semiconductor materials, such as Si, Ge, GaAs, InP, but not limited thereto. The substrate is generally formed with the structures like doped regions, gates, contacts and metal layers, wherein the doped regions may be conductive regions formed by doping dopants into the semiconductor-based substrate through ion implantation processes to serve as sources and drains of the devices. These doped regions may also be formed in fin structures formed in advance on the substrate, to manufacture fin-type field-effect transistor (FinFET). The gates may be polysilicon strip structure formed on the substrate, which all extend generally in a first direction D1 and are spaced apart in a second direction D2 perpendicular to the first direction D1 to function as gates of the devices and to connect with different devices. Contacts may be vertical columns with metal material like W/TiN, which is usually set on the doped regions or gates to connect these parts to overlying metal layers. The metal layers may be metal patterns formed of copper-based conductive lines, which constitute interconnects in semiconductor back end of line (BEOL) that connect various devices on the substrate.

Refer still to FIG. 3. The following component description will take a bit cell (BC) of the present invention as an example. In the preferred embodiment of present invention, a first gate $G_1$ is on the substrate and extends in the first direction D1. A first source $S_1$ and a first drain $D_1$ are respectively at two sides of the first gate $G_1$ in the substrate, so that the first gate $G_1$, the first source $S_1$ and the first drain $D_1$ constitute a write transistor WT, wherein the first gate $G_1$ serves as a gate of the write transistor WT, which is connected upwardly to a write word line (i.e. the write word line WWL in FIG. 1) through a contact $C_{WWL}$, while the first drain $D_1$ is connected upwardly to a write bit line (i.e. the write bit line WBL in FIG. 1) through a contact $C_{WBL}$. A second gate $G_2$ is on the substrate, which is preferably adjacent to the first gate $G_1$ and aligned with the first gate $G_1$ in the first direction D1. A common source $S_C$ and a second drain $D_2$ are respectively at two sides of the second gate $G_2$ in the substrate, so that the second gate $G_2$, the common source $S_C$ and the second drain $D_2$ constitute a first read transistor $RT_1$, wherein the second gate $G_2$ serves as a gate of the first read transistor $RT_1$. The second drain $D_2$ is connected upwardly to a read bit line (i.e. the read bit line RBL in FIG. 1) through a contact $C_{RBL}$ The common source $S_C$ is connected upwardly to a read word line (i.e. the read word line RWL in FIG. 1) through a contact $C_{RWL}$.

Refer still to FIG. 3. A third gate $G_3$ is on the substrate, which is preferably adjacent to the first gate $G_1$ and the second gate $G_2$ in the second direction D2. A third drain $D_3$ and a common source $S_C$ shared with the first read transistor $RT_1$ are provided respectively at two sides of the third gate $G_3$, so that the third gate $G_3$, the common source $S_C$ and the third drain $D_3$ constitute a second read transistor $RT_2$, wherein the third gate $G_3$ serves as a gate of the second read transistor $RT_2$. The third drain $D_3$ is connected upwardly to a read bit line (i.e. the read bit line RBL shown in FIG. 1) through a contact $C_{RBL}$, wherein the second drain $D_2$ and the third drain $D_3$ are connected to the same read bit line, while the common source $S_C$ is connected upwardly to a read word line (i.e. the read word line RWL shown in FIG. 1) through a contact $C_{RWL}$. In this way, the first read transistor $RT_1$ and the second read transistor $RT_2$ are in parallel connection to function collectively as a read device RT of the present invention, which may increase read current and improve device performance. In addition, in the design that tunnel field-effect transistors (TFET) are adopted for the first read transistor $RT_1$ and the second read transistor $RT_2$, the common source $S_C$ is preferably a P-type heavily-doped (P+) region, while the second drain $D_2$ and the third drain $D_3$ are preferably N-type heavily-doped (N+) regions.

Refer still to FIG. 3. Please note that in the embodiment of present invention, the third gate $G_3$ of second read transistor $RT_2$ extends in the first direction D1 to the position above the first source $S_1$ of read transistor WT and is connected therewith, and the junction of the first source $S_1$ and the third gate $G_3$ is the storage node SN of RAM in the present invention, where the third gate $G_3$ is connected upwardly to a capacitor (i.e. the capacitor C shown in FIG. 1) through a contact $C_C$, so that the voltage applied from the first drain $D_1$ may determine storage states of the storage node SN and affect channel resistances of the first read transistor $RT_1$ and the second read transistor $RT_2$. Furthermore, in the embodiment of present invention, the second gate $G_2$ and the third gate $G_3$ are connected with each other through a metal bridge 100. Preferably, the metal bridge 100 is at the ends of second gate $G_2$ and third gate $G_3$ in the first direction D1 and extends in the second direction D2 to connect the second gate $G_2$ and the third gate $G_3$. In this way, as shown in the figure, the second gate $G_2$, the third gate $G_3$ and the metal bridge 100 form a J-shaped layout pattern on the substrate plane when viewed from the top.

Figure 4:
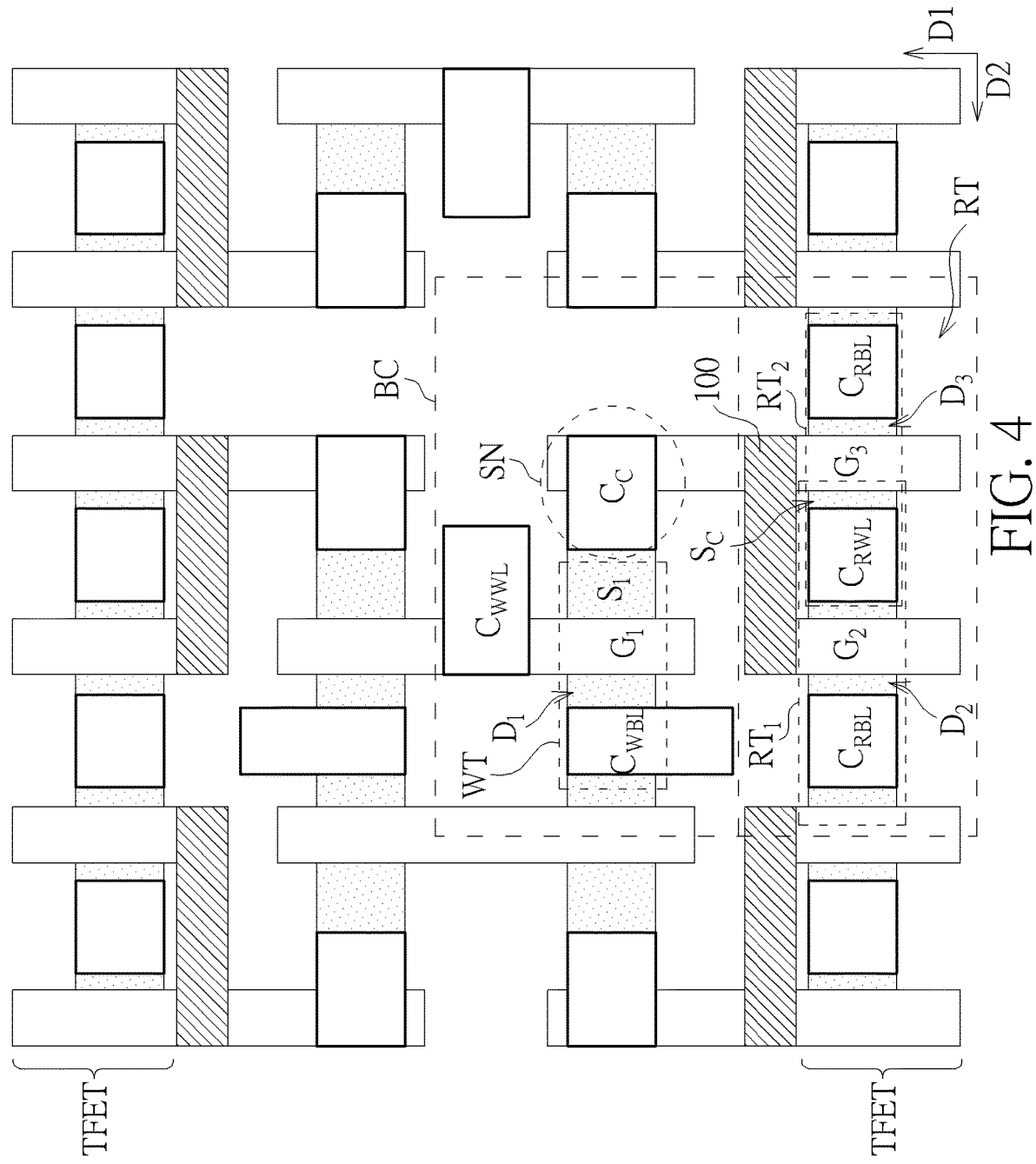
FIG. 4 is a circuit layout of a RAM in accordance with another embodiment of the present invention.

Please refer to FIG. 4, which is a schematic circuit diagram of a RAM in accordance with another embodiment of the present invention. The circuit layout in this embodiment is similar to the one of FIG. 3, with difference that the metal bridge 100 is connected to the middle of third gate $G_3$ and the other end of second gate $G_2$ in the first direction D1, which is preferably between the first gate $G_1$ and the second gate $G_2$. In this way, the second gate $G_2$, the third gate $G_3$ and the metal bridge 100 form a h-shaped layout pattern on the substrate plane when viewed from the top.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A random access memory, comprising:
   a write transistor with a first gate, a first source and a first drain, wherein said first gate is electrically connected to a write word line, and said first drain is electrically connected to a write bit line;
   a first read transistor with a second gate, a common source and a second drain;
   a second read transistor with a third gate, said common source and a third drain, wherein said third gate and said second gate are electrically connected to said first source of said write transistor, and a junction of said third gate, said second gate and said first source is a storage node, and said second drain and said third drain are electrically connected to a read bit line, and said common source is electrically connected to a read word line, so that said first read transistor and said second read transistor are in parallel connection; and
   a capacitor electrically connected to said storage node.

2. The random access memory of claim 1, further comprising a substrate, wherein said first gate, said second gate and said third gate are on said substrate and extend in a first direction, and said first gate, said second gate and said third gate are adjacent to each other, and a metal bridge is electrically connected to said second gate and said third gate, and said first source and said first drain are respectively at two sides of said first gate in said substrate, and said common source and said second drain are respectively at two sides of said second gate in said substrate, and said common source and said third drain are respectively at two sides of said third gate in said substrate.

3. The random access memory of claim 1, wherein a write operation of said random access memory comprises:
   applying a high voltage signal from said write word line to open said write transistor;
   applying a write voltage signal from said write bit line to said storage node through opened said write transistor, so that a storage state of said storage node is changed to high logic level.

4. The random access memory of claim 1, wherein a read operation of said random access memory comprises:
   applying a low level overdrive voltage to said read word line, so that a terminal of said read bit line is discharged and voltage-dropped; and sensing a value of voltage drop at said terminal of said read bit line to obtain a storage state of said storage node.

5. The random access memory of claim 1, wherein said second gate is adjacent to said first gate in said first direction and is aligned with said first gate in said first direction.

6. The random access memory of claim 1, wherein said third gate is adjacent to said first gate and said second gate in a second direction, and said third gate extends in said first direction to overlap said first gate and said second gate, and said second direction and said first direction are perpendicular.

7. The random access memory of claim 6, wherein said metal bridge extends in said second direction to positions above said second gate and said third gate to electrically connect said second gate and said third gate.

8. The random access memory of claim 7, wherein ends of said second gate and said third gate in said first direction are aligned, and said metal bridge is electrically connected with said second gate and said third gate at said ends, so that said second gate, said third gate and said metal bridge are J-shaped when viewed from the top.

9. The random access memory of claim 7, wherein ends of said second gate and said third gate in said first direction are aligned, and said metal bridge is electrically connected with the other end of said second gate and a middle of said third gate, so that said second gate, said third gate and said metal bridge are h-shaped when viewed from the top.

10. The random access memory of claim 1, wherein said third gate extends in said first direction to a position above said first source of said write transistor.

11. The random access memory of claim 1, wherein said first drain of said write transistor and said second drain of said first read transistor are aligned in said first direction, and said first source of said write transistor and said common source of said first read transistor and said second read transistor are aligned in said first direction.

12. The random access memory of claim 1, wherein said write transistor, said first read transistor and said second read transistor constitute a memory cell.

13. The random access memory of claim 1, wherein said write transistor is a metal-oxide-semiconductor field-effect transistor (MOSFET), and said first read transistor and said second read transistor are tunnel field-effect transistors (TFET).

14. The random access memory of claim 13, wherein said common source is P-type doped region, and said second drain and said third drain are N-type doped regions.

* * * * *